(12) United States Patent
Nakai

(10) Patent No.: US 6,297,968 B1
(45) Date of Patent: Oct. 2, 2001

(54) MOUNTING STRUCTURE FOR MOUNTING FLEXIBLE PRINTED CIRCUIT BOARD AND RECORDING/REPRODUCING APPARATUS USING SAME

(75) Inventor: Takashi Nakai, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/501,465

(22) Filed: Feb. 9, 2000

(30) Foreign Application Priority Data

Feb. 10, 1999 (JP) .................................................. 11-032719

(51) Int. Cl.⁷ .............................. H05R 7/14; G11B 21/02
(52) U.S. Cl. .......................... 361/803; 361/749; 361/784; 361/785; 361/807; 439/493
(58) Field of Search ..................................... 361/752, 753, 361/756, 749, 784, 785, 807; 439/153, 74, 493; 369/75.2

(56) References Cited

U.S. PATENT DOCUMENTS

| | | |
|---|---|---|
| 5,305,167 | 4/1994 | Nagase et al. . |
| 5,694,272 * | 12/1997 | Bang ..................................... 360/106 |
| 5,838,519 * | 11/1998 | Takizawa et al. .................... 360/106 |
| 6,146,189 * | 11/2000 | Nomura et al. ....................... 439/493 |

* cited by examiner

Primary Examiner—Jayprakash N. Gandhi
(74) Attorney, Agent, or Firm—Brinks Hofer Gilson & Lione

(57) ABSTRACT

An FPC mounting structure wherein an inner surface of a guide hole formed in a chassis is cut and raised to form a support projection, an FPC holder is formed with first and second holding portions which permit the support projection to be fitted therein, the FPC holder with a terminals-formed portion of the FPC attached thereto is inserted into the guide hole of the chassis and the first holding portion of the FPC holder to be fitted on the support projection, allowing the FPC holder to be supported by the chassis and allowing terminals on the FPC and circuit patterns on a printed circuit board to become conductive with each other.

6 Claims, 7 Drawing Sheets

MOUNTING STRUCTURE FOR MOUNTING FLEXIBLE PRINTED CIRCUIT BOARD AND RECORDING/REPRODUCING APPARATUS USING SAME

BACKGROUND OF THE INVENTION

1. Field of the Invention

The present invention relates to a mounting structure for mounting a flexible printed circuit board (hereinafter referred to simply as "FPC") which performs the transfer of signals to a recording head in a recording/reproducing apparatus using a recording/reproducing disk such as a floppy disk or a hard disk, as well as a recording/reproducing apparatus using the mounting structure.

2. Description of the Related Art

A recording/reproducing apparatus (hereinafter referred to simply as "apparatus") using a conventional flexible printed circuit board ("FPC" hereinafter) will be described below in connection with an example of a magnetic recording/reproducing apparatus. The conventional apparatus, is partially illustrated in FIG. 8, which shows a carriage 8 that can reciprocate in arrow A directions.

Figure 8:
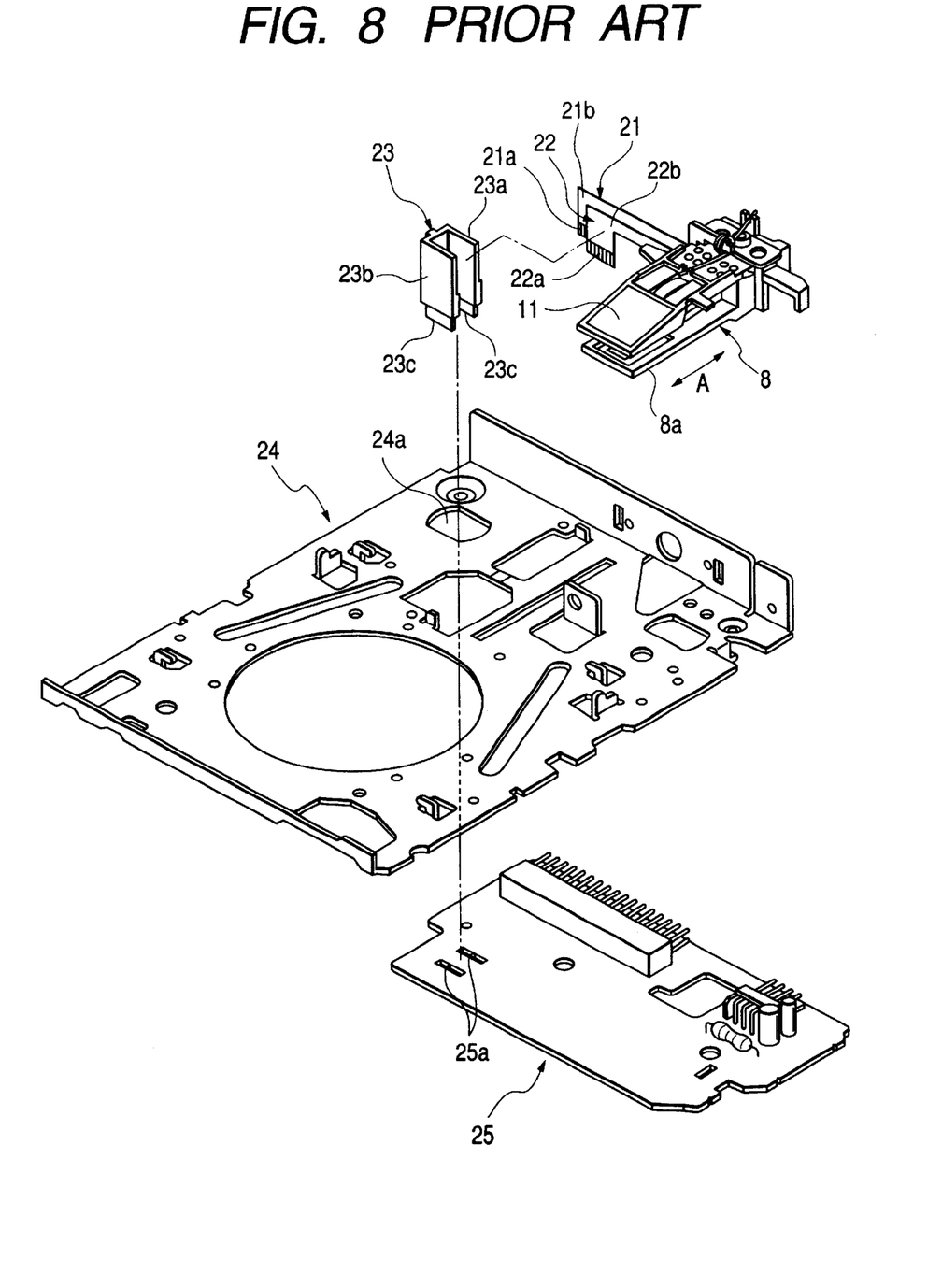
FIG. 8 is an exploded perspective view of a principal portion of a conventional recording/reproducing apparatus.

The carriage 8 is provided with a head mount 8a at a lower position and a pivotable head supporting arm 11 at an upper position. A pair of magnetic heads as recording heads (not shown) are mounted respectively to tip ends of the head mount 8a and the head supporting arm 11 in an opposed relation to each other.

The paired recording heads are brought into elastic contact respectively with the upper and lower sides of a recording disk such as a floppy disk (not shown). The recording disk is rotated at a high speed while the carriage 8 is allowed to reciprocate in the arrow A directions, whereby information can be recorded, reproduced, or erased, with respect to the upper and lower sides of the recording disk.

Figure 9:
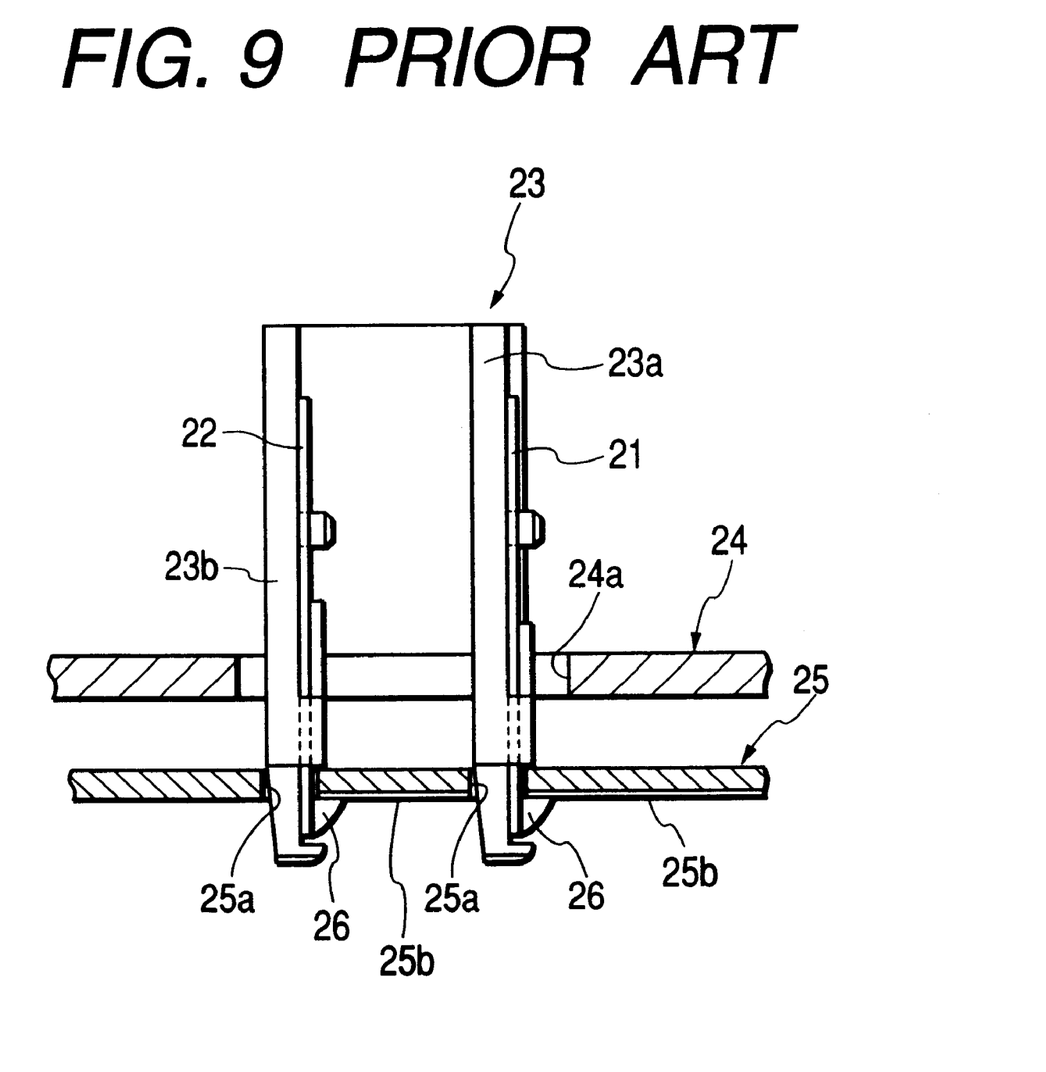
FIG. 9 is a sectional view of the portion of the conventional recording/reproducing apparatus shown in FIG. 8.

In an apparatus of this type, one end of each of the FPCs 21 and 22 is connected to one of a pair of recording heads (not shown), while the opposite ends thereof are connected through an FPC holder 23 to circuit patterns 25b formed on a printed circuit board 25 (as shown in FIG. 9).

In the conventional mounting structure for mounting the conventional FPCs 21 and 22, the FPCs 21 and 22 that are connected to the paired recording heads extend outwardly from the exterior of the carriage 8 and are attached to the FPC holder 23.

The FPCs 21 and 22 are, respectively, each provided on an end in its place thereof with terminals-formed portions 21b and 22b, on which are formed terminals 21a and 22a in an exposed state. Using a double-coated adhesive tape, the terminals-formed portions 21b and 22b are affixed, respectively, to FPC mounting portions 23a and 23b which are integral with the FPC holder 23. The FPC holder is formed in a general U shape.

The FPC holder 23, with the two FPCs 21 and 22 affixed thereto, is inserted through an aperture 24a formed in a chassis 24. The lower end portions 23c of the FPC holder 23 are inserted into mounting apertures 25a formed in the printed circuit board 25.

The terminals 21a and 22a of the FPCs 21 and 22, respectively and the circuit patterns 25b on the printed circuit board 25 are rendered conductive with each other electrically by solder 26.

In a recording/reproducing apparatus using such an FPC mounting structure, wherein the FPCs 21 and 22 are mounted to the printed circuit board 25 through the FPC holder 23, the FPCs 21 and 22 are not likely to fall down nor is there any fear that the terminals mounted on the printed circuit board 25 may become non-conductive, even if the carriage 8 is reciprocated in the arrow A directions at high speed, thus ensuring high reliability.

However, in the above conventional mounting structure for the FPCs 21 and 22, since the FPCs 21 and 22 are mounted to the FPC mounting portions 23a and 23b, which are integral with a single FPC holder 23, if there arises the necessity of repairing one of the paired recording heads due to failure thereof it has been impossible to remove the FPCs 21 and 22 the FPC holder 23 from the printed circuit board 25 unless the solders 26 of both FPCs are removed. Consequently, repairing the apparatus is difficult and time consuming (i.e., the repair efficiency is low).

In addition there often occurs wobbling in the FPC holder at the time of soldering the FPCs 21 and 22 to the printed circuit board 25. The terminals 21a and 22a on the FPCs 21 and 22 may be displaced from the circuit patterns 25b on the printed circuit board 25, which may result in one or both of the FPCs 21 and 22 being soldered in an unsatisfactory state.

SUMMARY OF THE INVENTION

It is an object of the present invention to solve the above-mentioned problems and provide an FPC mounting structure which permits work, including repair work, to be done easily, as well as a recording/reproducing apparatus using an improved mounting structure.

According to a first embodiment adopted by the present invention for solving the foregoing problems there is provided a mounting structure for mounting a flexible printed circuit board. The mounting structure comprises a flexible printed circuit board which has a terminals-formed portion on one side thereof with terminals being formed thereon in an exposed state, an FPC holder with the terminals-formed portion of the printed circuit board attached thereto, a printed circuit board having a mounting hole for mounting the terminals, and a chassis disposed above the printed circuit board. The chassis has a guide hole for guiding the terminals attached to the FPC holder into the mounting hole, wherein an inner surface of the guide hole is partially cut and raised to form a support projection. A holding portion which permits the support projection to be fitted therein is formed on the FPC holder. The FPC holder with the terminals-formed portion attached thereto is inserted into the guide hole formed in the chassis, and the holding portion of the FPC holder is fitted on the support projection, thereby allowing the FPC holder to be supported by the chassis and allowing the terminals and circuit patterns formed on the printed circuit board to be rendered conductive with each other.

According to a second embodiment adopted by the present invention for solving the foregoing problems, a retaining portion is provided in the FPC holder to fix the FPC holder to the mounting hole formed in the printed circuit board or to the guide hole formed in the chassis in a dislodgment preventing manner.

According to a third embodiment adopted by the present invention for solving the foregoing problems, a plural number of the FPC holders are disposed, a corresponding number of the guide holes to the plural number of the FPC holders are formed in an adjacent relation to each other, and the support projections in the adjacent guide holes are formed displacedly from each other so that extension lines of the support projections before being cut and raised do not overlap each other.

According to a fourth embodiment adopted by the present invention for solving the foregoing problems there is provided a recording/reproducing apparatus using the above flexible printed circuit board mounting structure.

DETAILED DESCRIPTION OF PREFERRED EMBODIMENTS

A mounting structure for mounting a flexible printed circuit board (hereinafter referred to simply as "FPC") according to the present invention and a recording/reproducing apparatus (simply as "apparatus" hereinafter) using the mounting structure will be described hereinunder with reference to the accompanying drawings.

Figure 1:
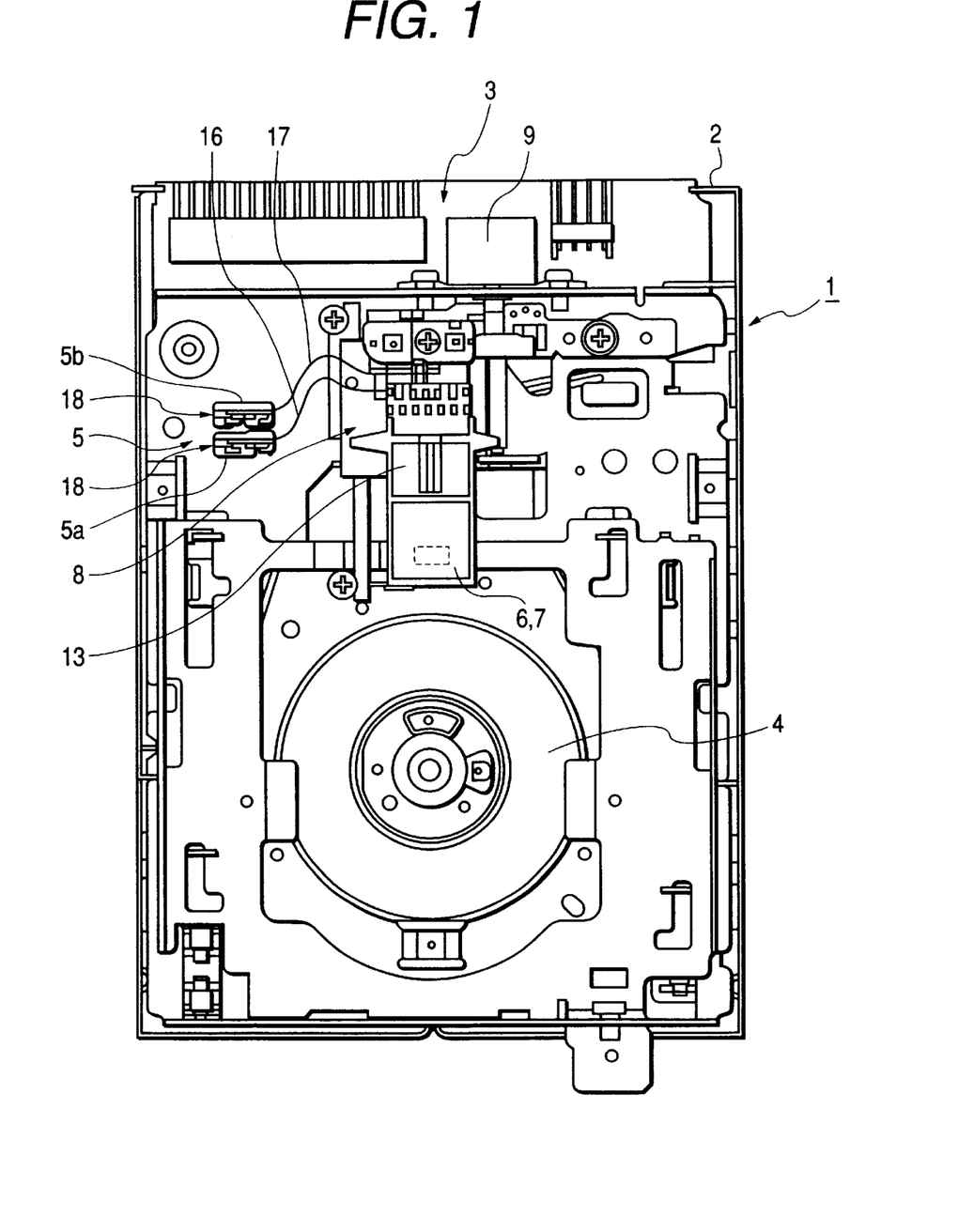
FIG. 1 is a plan view of a recording/reproducing apparatus according to the present invention.
Figure 2:
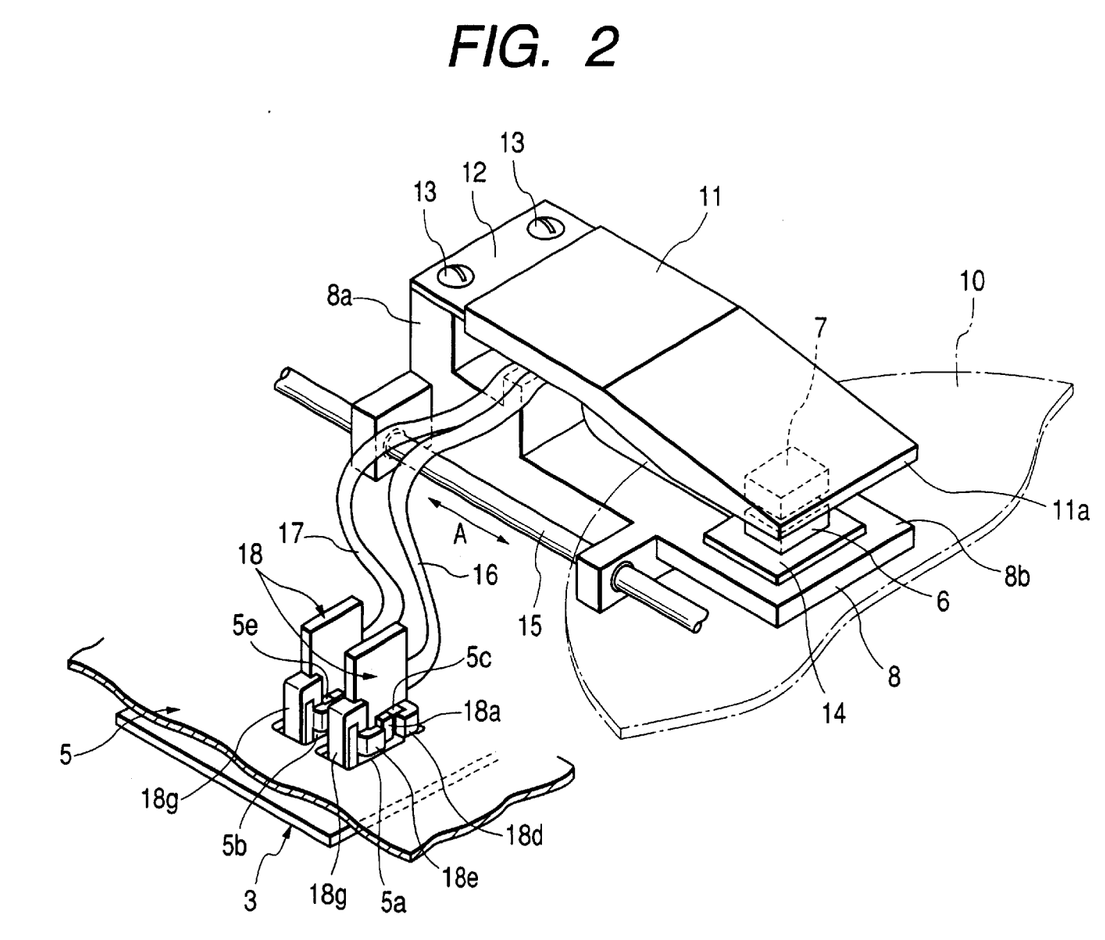
FIG. 2 is an enlarged perspective view of a principal portion of the recording/reproducing apparatus.
Figure 3:
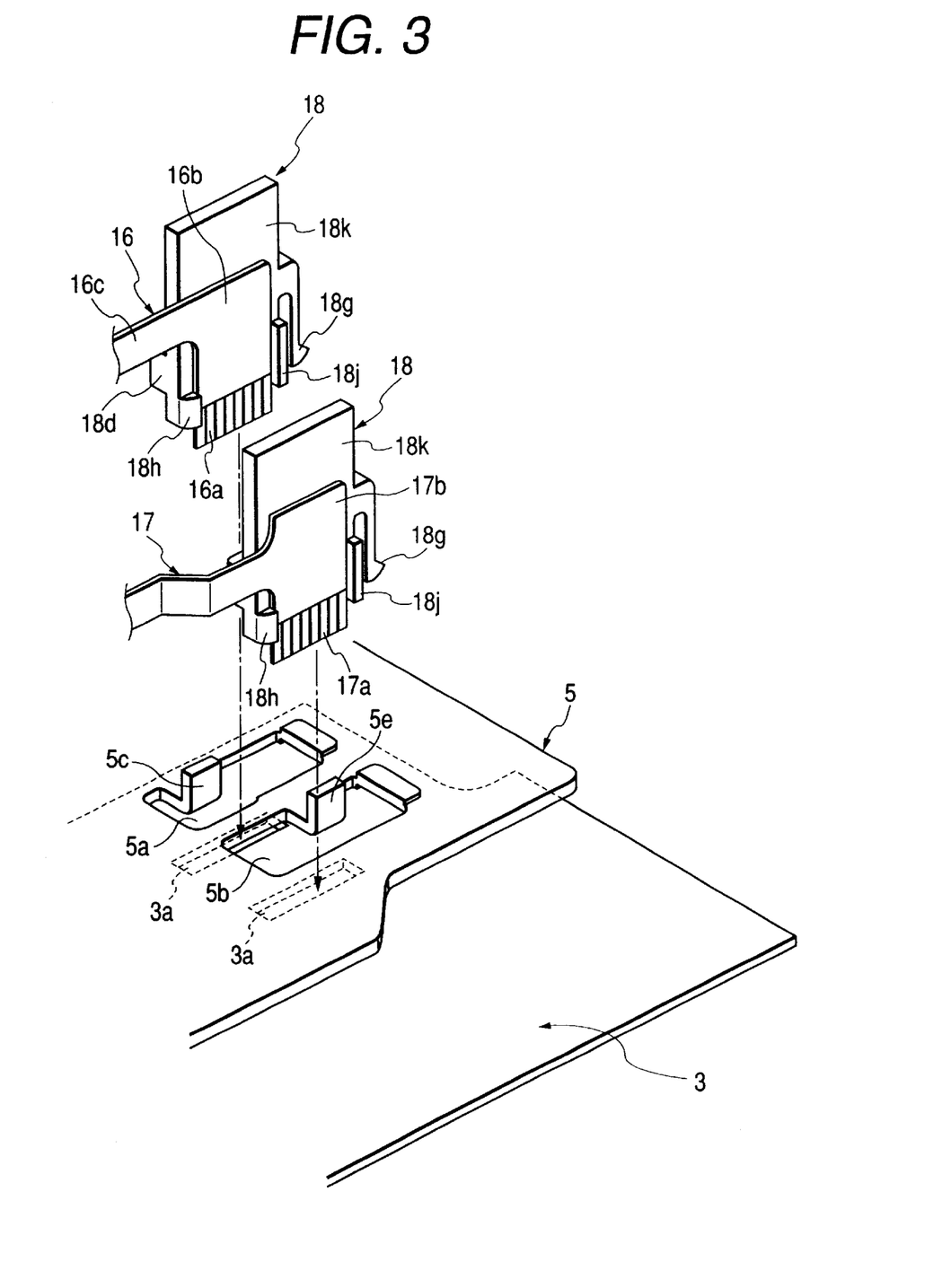
FIG. 3 is an exploded perspective view of a principal portion of the recording/reproducing apparatus, explaining an FPC mounting structure according to the present invention.
Figure 4:
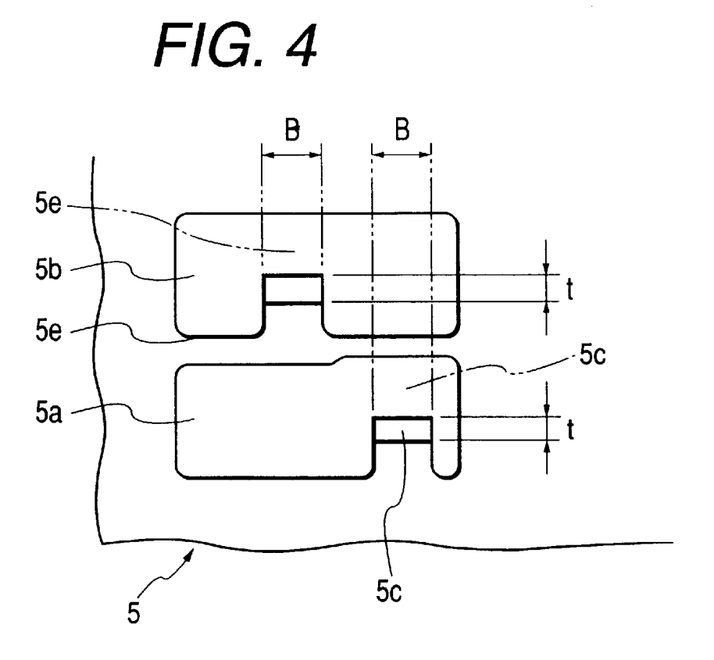
FIG. 4 is a plan view of a principal portion of a chassis used in the recording/reproducing apparatus.
Figure 5:
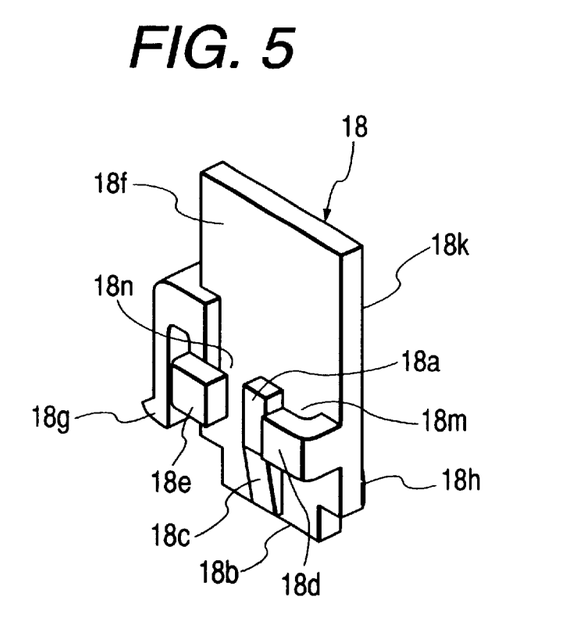
FIG. 5 is a perspective view of an FPC holder used in the recording/reproducing apparatus.
Figure 6:
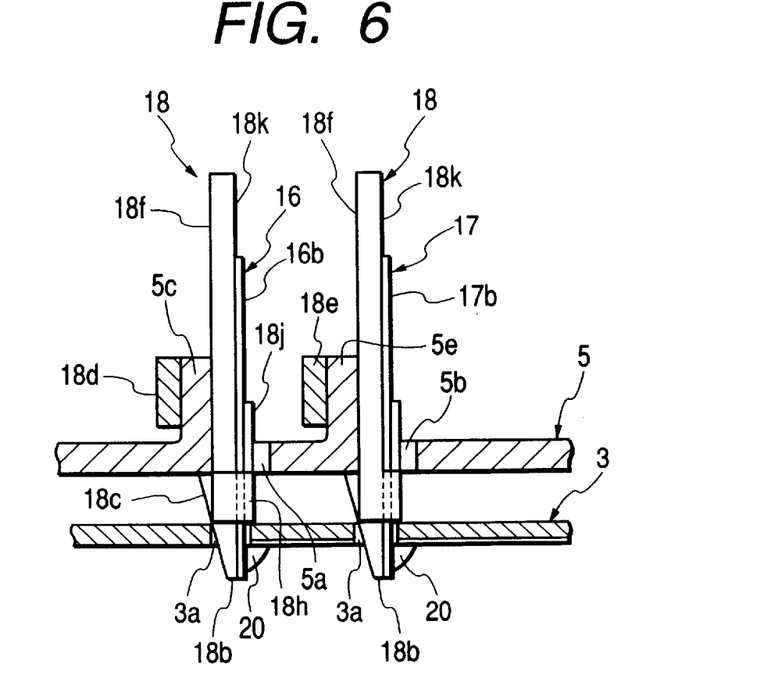
FIG. 6 is a sectional view of a principal portion of the recording/reproducing apparatus.
Figure 7:
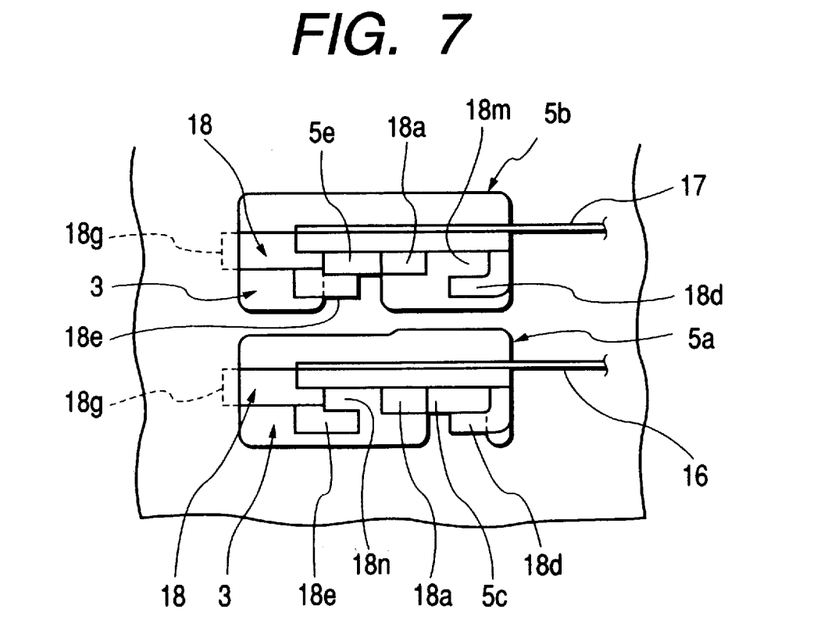
FIG. 7 is a schematic diagram explaining the FPC mounting structure according to the present invention.

FIG. 1 is a plan view of the apparatus according to the present invention, FIG. 2 is a partially enlarged perspective view thereof, FIG. 3 is an exploded perspective view of a principal portion of the apparatus, explaining the FPC mounting structure according to the present invention, FIG. 4 is a plan view of a principal portion of a chassis used in the apparatus, FIG. 5 is a perspective view of an FPC holder used in the apparatus, FIG. 6 is a sectional view of a principal portion of the apparatus, and FIG. 7 is a schematic plan view explaining the FPC mounting structure.

The apparatus according to the present invention, indicated at 1, will now be described by way of a magnetic recording/reproducing apparatus which uses a recording disk such as a floppy disk. As shown in FIG. 1, the apparatus 1 comprises a frame 2, which is open upward, and a relatively hard printed circuit board 3 formed of a phenolic resin or the like with circuit patterns (not shown) formed on the surface thereof.

Above the printed circuit board 3 is disposed a chassis 5 on which is mounted a turntable 4 for mounting and rotating thereon a recording disk 10 as indicated by a dash-double dot line in FIG. 2.

Nearly centrally of the chassis 5 is disposed a carriage 8 with a pair of recording heads 6 and 7 attached thereto, the recording heads 6 and 7 being magnetic heads.

A stepping motor 9 for reciprocating the carriage 8 in arrow A directions is mounted to the chassis 5.

In the carriage 8, as shown in FIG. 2, a head mount 8a is disposed on a lower side, while on an upper side with respect to the head mount 8a is disposed a head supporting arm 11 which is mounted pivotably with a plurality of machine screws 13 or the like through a plate spring 12.

A pair of recording heads 6 and 7 are secured, in a vertically opposed relation to each other, to opposed surfaces 8b and 11a of the head mount 8a and the head supporting arm 11 each through a mounting plate 14. The opposed surfaces 8b and 11 are positioned close to the front ends of the head mount 8a and the head supporting arm 11.

The carriage 8 can reciprocate in arrow A directions while being supported by a guide shaft 15.

With the paired recording heads 6 and 7 in contact with both upper and lower sides of the recording disk 10 shown in FIG. 2, the stepping motor 9 is operated, thereby causing the carriage 8 to move in arrow A directions and causing the recording heads 6 and 7 to reciprocate radially of the disk 10. In this state the disk 10 is rotated by rotation of the turntable 4, whereby information can be recorded, reproduced, or erased with respect to both upper and lower sides of the disk 10.

One end of each of the flexible filmy FPCs 16 and 17 is connected respectively to the paired recording heads 6 and 7, while opposite ends thereof are attached respectively to FPC holders 18 of the same shape. FPC holder 18 and in this state are mounted respectively to mounting holes 3a formed in the printed circuit board 3.

Recording/reproducing signals or other signals provided from a control unit (not shown) mounted on the printed circuit board 3 side are transmitted to the recording heads 6 and 7 through the FPCs 16 and 17.

The FPC mounting structure according to the present invention, which is used in the apparatus 1, will now be described with reference to FIGS. 3 to 7. First, as shown in FIG. 3, a pair of elongated mounting holes 3a are formed in the printed circuit board 3. Into the mounting holes 3a are inserted terminals 16a and 17a of the FPCs 16 and 17 and lower end portions 18b of the FPC holders 18.

In the chassis 5 located above the mounting holes 3a are formed elongated guide holes 5a and 5b by a number corresponding to the number of the FPC holders 18 in a direction perpendicular to the moving direction A of the carriage 8. The guide holes 5a and 5b are formed in positions adjacent to each other.

Longitudinal inner surfaces of the guide holes 5a and 5b are partially cut and raised to form support projections 5c and 5e. As shown in FIG. 4, the support projections 5c and 5e each have a thickness of t and a width of B.

The support projections 5c and 5e are displaced from each other so that extension lines of the support projections before being cut and raised, which are indicated by dash-double dot lines in FIG. 4, do not overlap each other.

Since the support projections 5c and 5e are displaced from each other, even if the adjacent guide holes 5a and 5e are formed closed to each other, the support projections 5c and 5e can be cut and raised accurately without deformation.

Since terminals-formed portions 16b and 17b of the FPCs 16 and 17 are of the same shape and same configuration, an explanation of only the FPC 16 side will be given below and that of the FPC 17 side will be omitted.

As shown in FIG. 3, the FPC 16 is provided at a lower end portion of one side thereof with the terminals-formed portion 16b with a plurality of lands formed by copper foil or the like being exposed as terminals 16a, while circuit patterns (not shown) connected to the lands are formed in a drawn-out state on an upper side with respect to the terminals 16a.

A plastic film or the like is bonded to an upper surface of each of the circuit patterns by lamination or any other suitable means to insulate the pattern surfaces.

A connecting portion 16=i cis extended leftward from the terminals-formed portion 16b shown in FIG. 3, with the circuit patterns (not shown) being extended also to the connecting portion 16c, and the FPCs 16 and 17 are each connected on one end side thereof to the recording head 6 or 7.

A double-coated adhesive tape (not shown) or the like is affixed to the back of the terminals-formed portion 16b where the terminals 16a are not exposed, to bond the terminals-formed portion 16b and the FPC holder 18 with each other.

The FPC holder 18 is formed in the shape of a flat plate as a whole, as shown in FIG. 5, using a resin material or the like. On one side 18f of the FPC holder 18 there is formed a projection 18a nearly centrally at a lower position, the projection 18a having predetermined height and width and extending toward the lower end portion 8b. The projection 18a has a tapered surface 18c extending toward the lower end portion 18b.

First and second arm portions 18d, 18e are formed at positions near the lower end portion 18b of the FPC holder 18 so as to extend from both right and left sides in the figure toward the central projection 18a. Between the first and second arm portions 18d, 18e and one side 18f there are formed first and second holding portions 18m, 18n, which are predetermined gaps.

The first and second holding portions 18m, 18n are formed so as to permit the support projections 5c and 5e of the chassis 5 to be fitted therein, the support projections 5c and 5e each having a thickness of t and a width of B.

Thus, even if the support projections 5c and 5e are displaced from each other, it is possible to use one type of FPC holder 18.

In FIG. 3, on the right side face of the FPC holder 18 there is formed an elastically deformable, hook-shaped retaining portion 18g. On a side 18k opposite to the one side 18f with the first and second holding portions 18m and 18n formed thereon there are formed guide portions 18h and 18j for positioning the terminals-formed portion 16b of the FPC 16.

With the terminals-formed portion 16b positioned by the guide portions 18h and 18j of the FPC holder 18, the FPC 16 is bonded to the FPC holder 18 by means of a double-coated adhesive tape (not shown) in such a manner that the lower ends of the terminals 16a and the lower end portion 18b of the FPC holder 18 are flush with each other.

The FPC holder 18 to which the FPC 16 is bonded is mounted to the printed circuit board 3 in the following manner. When the lower end portion 18b of the FPC holder 18 is inserted into the guide hole 5a of the chassis 5 in the direction of arrow in FIG. 3, the first holding portion 18m is fitted on the support projection 5c and the lower end portion 18b of the FPC holder 18 and the terminals 16a are inserted and positioned in the associated mounting hole 3a formed in the printed circuit board 3, whereby the terminals 16a and circuit patterns (not shown) on the printed circuit board are aligned with each other.

Since the first holding portion 18m is fitted on the support projection 5c, the FPC holder 18 can be held without wobbling on the chassis 5.

The guide portions 18h and 18j of the FPC holder 18 come into abutment against the surface of the printed circuit board 3 to stop insertion of the FPC holder into the guide hole 5a and the mounting hole 3a.

At this time, the retaining portion 18g comes into engagement with the guide hole 5a by a snap-in fitting and the FPC holder 18 is fixed to the guide hole 5a while being prevented from dislodgment under an elastic force of the retaining portion 18g.

It is not always required that the retaining portion 18g be engaged with the guide hole 5a by a snap-in fitting. The retaining portion 18g may be extended downward in the figure into a snap-in fitting with the associated mounting hole 3a formed in the printed circuit board 3.

With the FPC holder 18 and the guide holes 5a engaged with each other by a snap-in fitting, as shown in FIG. 6, the terminals 16a and 17a of the FPCs 16 and 17 protruded from the mounting holes 3a of the printed circuit board 3 and the circuit patterns (not shown) formed on the printed circuit board are connected together by solder 20 and are thereby rendered conductive with each other electrically. In this way the FPC mounting structure according to the present invention is assembled.

In the apparatus 1 using the above FPC mounting structure, since the terminals-formed portions 16b and 17b of the FPCs 16 and 17 are attached to the FPC holders 18 and 19 and are reinforced thereby, even when the carriage 8 reciprocates in the arrow A directions, there is no fear that the terminals 16a and 17a soldered to the printed circuit board 3 may fall down. Thus, even if the carriage 8 is reciprocated repeatedly in the arrow A directions, it is unlikely that the conduction between the FPCs 16, 17 and that the printed circuit board 3 will become unstable, thus permitting the apparatus 1 to be prolonged in its service life.

Although in the above description of the apparatus 1 reference was made to the magnetic recording/reproducing apparatus using the recording disk 10 such as a floppy disk, the apparatus 1 is not limited to such a magnetic recording/reproducing apparatus, but is widely applicable to other types of recording/reproducing apparatuses, e.g. one using an optical system.

In the flexible printed circuit board mounting structure according to the present invention, as set forth above, an inner surface of a guide hole formed in a chassis is partially cut and raised to form a support projection, an FPC holder is formed with a holding portion in which the support projection can be fitted, the FPC holder with a terminals-formed portion of an FPC attached thereto is inserted into the guide hole of the chassis, allowing the holding portion to be fitted on the support projection and thus allowing the chassis to support the FPC holder, and the terminals and circuit patterns formed on a printed circuit board are rendered conductive with each other. Therefore, even when a plurality of FPCs are to be mounted, the FPC holder is attached to each of the FPCs. Thus, for example, when there arises the necessity of repair of the apparatus, only the FPC concerned can be removed easily from the printed circuit board and therefore it is possible to shorten the time required for the repair.

Moreover, since the FPC holder is provided with a retaining portion, and through this retaining portion the FPC holder is fixed anti-dislodgmentwise to the mounting hole formed in the printed circuit board or to the guide hole formed in the chassis, the FPC holder can be fixed to the chassis or the printed circuit board positively while ensuring the prevention of dislodgment thereof, and the soldering work for soldering the FPC to the printed circuit board can be done efficiently.

Further, a plural number of FPC holders are used, a corresponding number of the above described guide holes to the plural number of FPC holders are formed in an adjacent relation to each other, and the support projections are formed in the guide holes displacedly from each other so that extension lines of the support projections before being cut and raised do not overlap each other. Therefore, the support projections can each be cut and raised with a high accuracy without deformation, and the FPC holder can be positioned and soldered accurately in the mounting hole formed in the printed circuit board.

Further, since the recording/reproducing apparatus according to the present invention uses the flexible printed circuit board mounting structure described above, if an FPC is to be removed for repair from the printed circuit board, only that FPC can be easily removed from the printed circuit board and thus the apparatus according to the present invention is easy to repair.

What is claimed is:

1. A mounting structure for mounting a flexible printed circuit board, comprising:
   a flexible printed circuit board (FPC) which has a terminals-formed portion on one side thereof with terminals being formed thereon in an exposed state;
   FPC holder with the terminals-formed portion of the flexible printed circuit board attached thereto;
   a printed circuit board having a mounting hole for mounting the terminals; and
   a chassis disposed above the printed circuit board, the chassis having a guide hole for guiding the terminals attached to the FPC holder into the mounting hole,
   wherein an inner surface of the guide hole is partially cut and raised to form a support projection, a holding portion which permits the support projection to be fitted therein is formed on the FPC holder, the FPC holder with the terminals-formed portion attached thereto is inserted into the guide hole, and the holding portion of the FPC holder is fitted on the support projection, thereby allowing the FPC holder to be supported by the chassis and allowing the terminals and circuit patterns formed on the printed circuit board to be rendered conductive with each other.

2. The mounting structure for mounting a flexible printed circuit board according to claim 1, wherein a retaining portion is provided in the FPC holder to fix the FPC holder anti-dislodgmentwise to the mounting hole formed in the printed circuit board or to the guide hole formed in the chassis.

3. The mounting structure for mounting a flexible printed circuit board according to claim 1, wherein a plural number of the FPC holders are disposed, a corresponding number of the guide holes to the plural number of the FPC holders are formed in an adjacent relation to each other, and the support projections in the adjacent guide holes are formed displacedly from each other so that extension lines of the support projections before being cut and raised do not overlap each other.

4. A recording/reproducing apparatus having a mounting structure, the mounting structure comprising:
   a flexible printed circuit board which has a terminals-formed portion on one side thereof with terminals being formed thereon in a exposed state;
   an FPC holder with the terminals-formed portion of the flexible printed circuit board attached thereto;
   a printed circuit board having a mounting hole for mounting the terminals; and
   a chassis disposed above the printed circuit board, the chassis having a guide hole for guiding the terminals attached to the FPC holder into the mounting hole,
   wherein an inner surface of the guide hole is partially cut and raised to form a support projection, a holding portion which permits the support projection to be fitted therein is formed on the FPC holder, the FPC holder with the terminals-formed portion attached thereto is inserted into the guide hole, and the holding portion of the FPC holder is fitted on the support projection, thereby allowing the FPC holder to be supported by the chassis and allowing the terminals and circuit patterns formed on the printed circuit board to be rendered conductive with each other.

5. The recording/reproducing apparatus of claim 4, wherein the mounting structure further comprises a retaining portion provided in the FPC holder to fix the FPC holder anti-dislodgmentwise to the mounting hole formed in the printed circuit board or to the guide hole formed in the chassis.

6. The recording/reproducing apparatus of claim 4, wherein a plural number of the FPC holders are disposed, a corresponding number of the guide holes to the plural number of the FPC holders are formed in an adjacent relation to each other, and the support projections in the adjacent guide holes are formed displacedly from each other so that extension lines of the support projections before being cut and raised do not overlap each other.

* * * * *

UNITED STATES PATENT AND TRADEMARK OFFICE
CERTIFICATE OF CORRECTION

PATENT NO.    : 6,297,968 B1
DATED         : October 2, 2001
INVENTOR(S)   : Takashi Nakai It is certified that error appears in the above-identified patent and that said Letters Patent is hereby corrected as shown below:

Column 7,
Line 18, delete "Amounting" and substitute -- A mounting -- in its place.

Signed and Sealed this

Seventeenth Day of September, 2002

Attest:

JAMES E. ROGAN
Director of the United States Patent and Trademark Office

Attesting Officer